(12) United States Patent
Frijns

(10) Patent No.: US 8,766,212 B2
(45) Date of Patent: Jul. 1, 2014

(54) CORRECTION OF SPATIAL INSTABILITY OF AN EUV SOURCE BY LASER BEAM STEERING

(75) Inventor: Olav Waldemar Vladimir Frijns, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 856 days.

(21) Appl. No.: 11/488,918

(22) Filed: Jul. 19, 2006

(65) Prior Publication Data
US 2008/0017810 A1 Jan. 24, 2008

(51) Int. Cl.
*H05H 1/24* (2006.01)
*H05G 2/00* (2006.01)

(52) U.S. Cl.
CPC ...... *H05H 1/24* (2013.01); *H05G 2/008* (2013.01)
USPC .................................. 250/492.1; 250/493.1

(58) Field of Classification Search
CPC ................................. H05H 1/24; H05G 2/008
USPC ............... 250/423 R, 26, 423 P, 423 F, 491.1, 250/492.2, 492.1, 492.22, 504 R, 515.14, 250/492.21
See application file for complete search history.

(56) References Cited

U.S. PATENT DOCUMENTS

| 4,896,341 A * | 1/1990 | Forsyth et al. ............... 378/34 |
| 5,499,100 A * | 3/1996 | Tanaka ........................ 250/548 |
| 5,668,848 A * | 9/1997 | Rieger ......................... 378/125 |
| 5,725,914 A * | 3/1998 | Opower ....................... 427/592 |
| 5,991,360 A * | 11/1999 | Matsui et al. ................. 378/119 |
| 6,069,937 A * | 5/2000 | Oshino et al. ................. 378/119 |
| 6,448,563 B1 * | 9/2002 | Hauck et al. .................. 250/373 |
| 7,113,261 B2 * | 9/2006 | Dierichs et al. ................ 355/68 |
| 7,217,940 B2 * | 5/2007 | Partlo et al. ............... 250/504 R |
| 2002/0009176 A1 * | 1/2002 | Amemiya et al. ............. 378/119 |
| 2004/0227922 A1 * | 11/2004 | Dierichs et al. ................. 355/71 |
| 2005/0199829 A1 * | 9/2005 | Partlo et al. ............... 250/504 R |

(Continued)

FOREIGN PATENT DOCUMENTS

DE 103 59 464 A1 7/2005
EP 1 401 248 A2 3/2004

(Continued)

OTHER PUBLICATIONS

International Search Report dated Feb. 15, 2008 for International Application No. PCT/NL2007/050328.

*Primary Examiner* — Nicole Ippolito
*Assistant Examiner* — Brooke Purinton
(74) *Attorney, Agent, or Firm* — Pillsbury Winthrop Shaw Pittman LLP

(57) ABSTRACT

A method to align a discharge axis of a discharge radiation source with respect to optics of the lithographic apparatus includes creating a discharge in a substance in a discharge space between an anode and a cathode to form a plasma so as to generate electromagnetic radiation. The discharge is triggered by irradiating an area on a surface proximate the discharge space with an energetic beam. The position of the area is controlled in response to a property of the radiation in the lithographic apparatus and/or the temperature of a collector of the lithographic apparatus. Controlling the position of the area which is irradiated improves alignment of the discharge axis with the different lithographic modules, such as the contamination barrier, the illumination system, the substrate table and/or the projection system.

20 Claims, 4 Drawing Sheets

(56) References Cited

U.S. PATENT DOCUMENTS

| | | |
|---|---|---|
| 2005/0270511 A1* | 12/2005 | Dierichs et al. ............. 355/67 |
| 2006/0140232 A1 | 6/2006 | Hergenhan et al. |
| 2007/0057201 A1* | 3/2007 | Neerhof et al. ........... 250/492.2 |
| 2007/0085043 A1* | 4/2007 | Leonardus Franken et al. .................... 250/504 R |
| 2007/0090304 A1* | 4/2007 | Jonkers et al. ........... 250/504 R |
| 2007/0152175 A1* | 7/2007 | Moors et al. ............... 250/493.1 |
| 2013/0256568 A1* | 10/2013 | Endo et al. ............... 250/504 R |

FOREIGN PATENT DOCUMENTS

| | | |
|---|---|---|
| WO | 00/25322 A1 | 5/2000 |
| WO | 2005/091879 A2 | 10/2005 |
| WO | 2005/101924 A1 | 10/2005 |

* cited by examiner

CORRECTION OF SPATIAL INSTABILITY OF AN EUV SOURCE BY LASER BEAM STEERING

BACKGROUND OF THE INVENTION

1. Field of the Invention

The present invention relates to a radiation system, a lithographic apparatus comprising such a radiation system and a method of aligning a discharge axis of a discharge radiation source with respect to optics of a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

A radiation source for EUV radiation may be a discharge plasma radiation source, in which a plasma is generated in a substance (for instance, a gas or vapor) between an anode and a cathode and in which a high temperature discharge plasma may be created by Ohmic heating by a (pulsed) current flowing through the plasma. Further, compression of a plasma due to a magnetic field generated by a current flowing through the plasma may be used to create a high temperature, high density plasma on a discharge axis (pinch effect). Stored electrical energy is directly transferred to the plasma temperature and hence to short-wavelength radiation. A pinch may allow for a plasma having considerably higher temperature and density on the discharge axis, offering an extremely large conversion efficiency of stored electrical energy into thermal plasma energy and thus into EUV radiation.

In an EUV discharge source the pinch may be triggered by a laser beam on the electrodes. However, even when the laser beam is constantly pointed at a fixed position, the exact origin of the pinch may vary. As a consequence the resulting pinch and its axis may vary. This may result in inaccurate aligning of the radiation beam with respect to the optics of a lithographic apparatus receiving the beam.

SUMMARY OF THE INVENTION

It is desirable to provide an EUV discharge radiation source wherein the pinch (i.e. the discharge axis) is aligned with optics of a lithographic or other apparatus receiving radiation from the source. According to an embodiment of the present invention, a radiation system comprises a radiation source having a cathode and an anode that are configured to create a discharge in a substance in a discharge space between the anode and the cathode to form a plasma so as to generate electromagnetic radiation, the radiation system further comprising a triggering device configured to initiate the discharge by irradiating an area on a surface of a predetermined material proximate the discharge space with an energetic beam, wherein the triggering device is configured to control a position of the area in response to at least one input signal.

According to another embodiment of the invention, a lithographic apparatus comprises an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate, wherein the lithographic apparatus comprises a radiation system as described above for providing the radiation beam.

According to a further embodiment, a method of aligning a discharge axis of a discharge radiation source with respect to optics of a radiation system comprises creating a discharge in a substance in a discharge space between an anode and a cathode to form a plasma so as to generate electromagnetic radiation; triggering the discharge by irradiating an area on a surface of a predetermined material proximate the discharge space with an energetic beam; and controlling a position of the area in response to at least one input signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
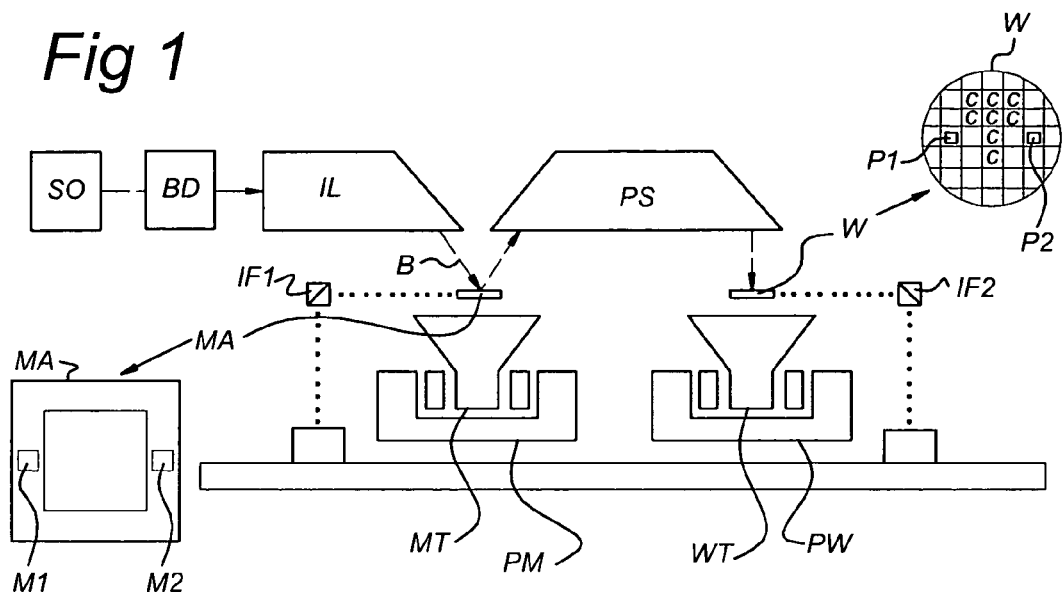
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameter. A projection system (e.g. a refractive projection lens system) PS is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an embodiment of the invention, a radiation system comprises a radiation source having an anode and a cathode that are configured to create a discharge in a substance in a discharge space. A plasma is formed in the discharge space so as to generate electromagnetic radiation, in particular EUV radiation. The radiation system also comprises a triggering device configured to initiate a discharge by irradiating an area on a surface proximate the discharge space with an energetic beam, for example a laser beam.

FIGS. 2A to 2E are used to explain the general principle of pinch triggering using a beam of laser light 38. The figures show a cross-section through a radiation source, comprising an anode 20 and a cathode 10 that are electrically isolated. The assembly is substantially sealed, and supplied with a gas or vapor at low pressure, for instance xenon or lithium, from a discharge material supply (not shown). The anode 20 and cathode 10 are connected to a discharge power supply (not shown). Discharge field lines 45 are also shown. Pinch formation may be triggered using a suitable beam of laser light 38, for instance wavelength: 254-1060 nm, power: 10-100 W in 1-100 ns, diameter: 0.1-1 mm.

Figure 2A:
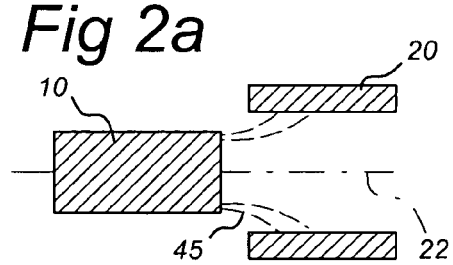
FIGS. 2A to 2E depict a radiation source the pinch of which is triggered by a beam of laser light.
Figure 2B:
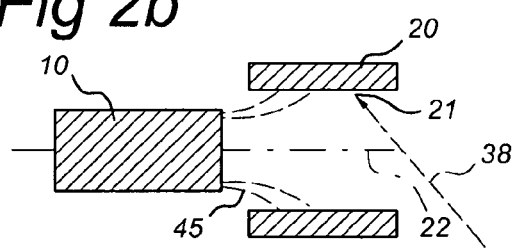
Figure 2C:
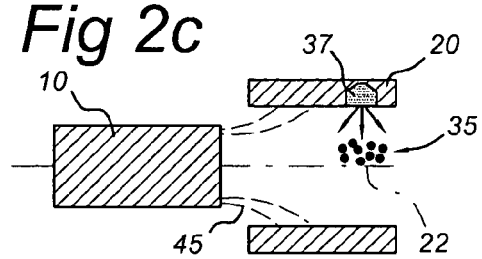
Figure 2D:
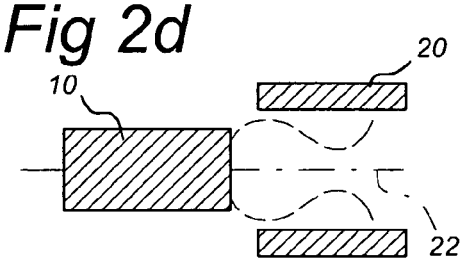
Figure 2E:
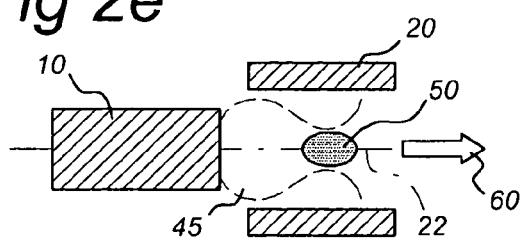

As depicted in FIG. 2A, the radiation source is brought into a state where a pinch is about to form, using the discharge power supply (not shown) and the discharge material supply (not shown). For instance, the anode 20 is connected to ground, the cathode 10 is connected to an AC voltage of 11 kV at 100 Hz, and xenon is supplied at a rate of 5-50 sccm (standard cubic centimeters per minute). At a predetermined moment in the cycling of the discharge power supply (not shown), the beam of laser light 38 may be fired at a predetermined area 21 on the surface of e.g. the anode 20, see FIG. 2B. The beam of laser light 38 causes a region 37 to be heated, and some of the material 35 will be evaporated from the surface (ablation) of anode 20 as shown in FIG. 2C. The ejected material 35 enters the discharge region, and triggers the pinch effect (see FIG. 2D) that results in a constriction (pinch) 50 containing hot plasma, see FIG. 2E. This plasma has a high resistance due to its small cross-section, and effectively transforms the electrical energy of the discharge into thermal energy of the plasma, and finally into emitted radiation 60 along a discharge axis 22. After a while the pinch will disappear and the radiation source will return to a state of diffused discharge, see FIG. 2A.

Due to electrode erosion, electrode deformation, and/or variations in the supply rate of discharge material, uncertainties in the spatial position of the discharge are caused. As a consequence, the discharge axis 22 will slightly vary which may cause inaccuracies of exposures in the lithographic apparatus. In order to correct for these variations of the discharge axis 22, according to an embodiment, the triggering device is configured to control a position of the area 21 in response to at least one input signal. The invention is based on the insight that the direction of the discharge axis 22 of the plasma is determined by the specific position of the area 21 on which the laser beam 38 is directed.

Figure 3:
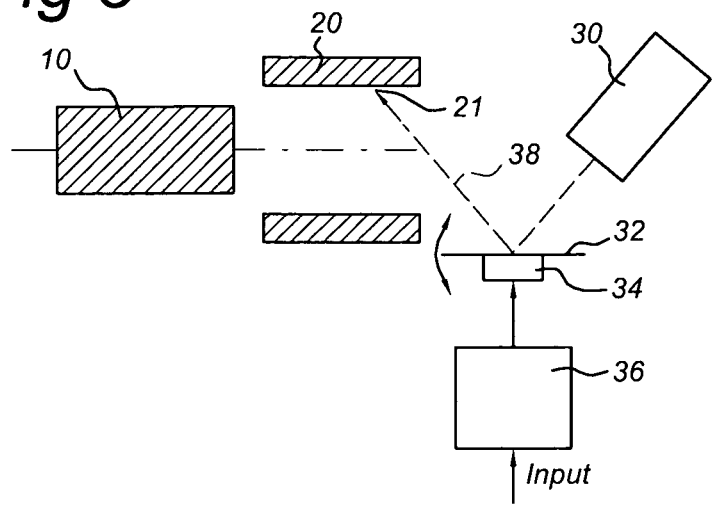
FIG. 3 depicts an embodiment in which the triggering device comprises an energetic beam source configured to generate the energetic beam.

FIG. 3 shows an embodiment in which the triggering device comprises energetic beam source 30 configured to generate the energetic beam 38. The triggering device further comprises a mirror 32 configured to reflect the energetic beam 38 to the area 21. An actuator 34 is configured to control the position of the mirror 32 in response to at least one input signal. The input signal may be provided by a sensor (not shown in FIG. 3) configured in the lithographic apparatus, as will be explained in more detail below. Furthermore, the triggering device may comprise a processor 36 configured to receive the input signal and convert the input signal into a control signal for the actuator 34, see FIG. 3.

The actuator 34 may tilt or move up/down the mirror 32 in one or more directions so that the position of the area 21 where the laser beam 38 hits the anode 20 changes. It should be appreciated that instead of an area of the anode 20, an area on the cathode 10 or any other suitable surface in or near the discharge space may be irradiated.

Figure 4:
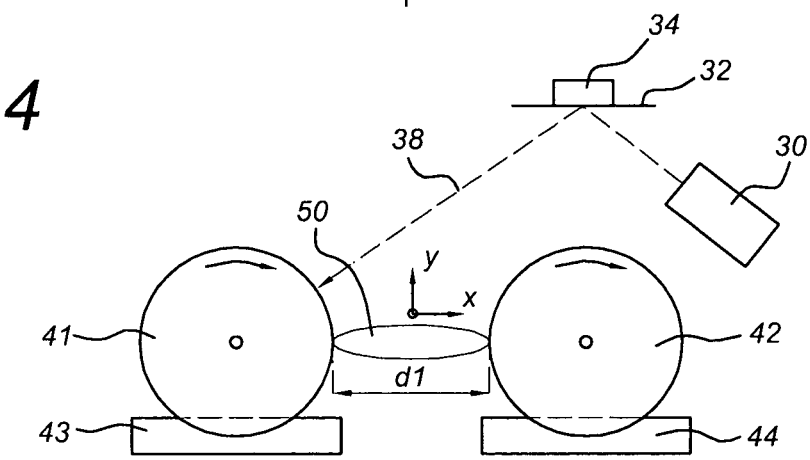
FIG. 4 depicts an embodiment in which the radiation source comprises a cathode and an anode being wheel shaped.

FIG. 4 shows an embodiment in which the radiation source comprises a cathode 41 and an anode 42, the anode 42 and cathode 41 being shaped as wheels. The radiation source further comprises two liquid baths 43, 44 in use containing a metal liquid such as Sn. The cathode 41 and anode 42 are configured to turn and are positioned and dimensioned so as to be wetted in the respective baths 43, 44. By rotating the cathode and anode, the surface of the cathode 41 and anode 42 will constantly be covered with a liquid film. The anode 41 and cathode 42 are connected to a discharge power supply (not shown).

The radiation system further comprises laser beam source 30 which is configured to direct a laser beam onto mirror 32 which redirects the laser beam 38 onto a surface of the cathode 41. The position of the mirror 32 is determined by actuator 34. The actuator 34 may receive control signals from the processor 36, see FIG. 3.

If an electrical field is generated between the cathode 41 and the anode 42, and if a gas is applied to the discharge space between the cathode 41 and the anode 42, a discharge may be generated. Preferably there is no gas in the discharge space, only the material ablated from the cathode wheel. Gas which is present e.g. due to the debris mitigation system acts as a buffer gas and reduces the efficiency of the discharge.

This discharge can be triggered by the laser beam 38. As explained above, a temporary pinch 50 is formed in the discharge space, see FIG. 4. The exact direction and form and position of this pinch 50 is amongst others, dependent on the position of the laser beam on the cathode 41. A change in the position of the laser beam 38 on the cathode 41 will result in a (small) change of orientation and position of the pinch 50, i.e. a change in the direction of the discharge axis. In FIG. 4 the dimension of the distance d1 between the cathode 41 and anode 42 is exaggerated. In practice, the distance between the two wheels 41, 42 is about 2-5 mm whereas the diameter of the wheels 41, 42 is about 5 cm.

By irradiating the surface of the cathode 41 (or of the anode 42), the surface is locally heated and some of the material will be evaporated from the surface. This ablation initiates the pinch 50. Due to the constant supply of liquid metal from the baths 43, 44 onto the cathode 41 and anode 42, the surface of these electrodes will be repaired.

Figure 5:
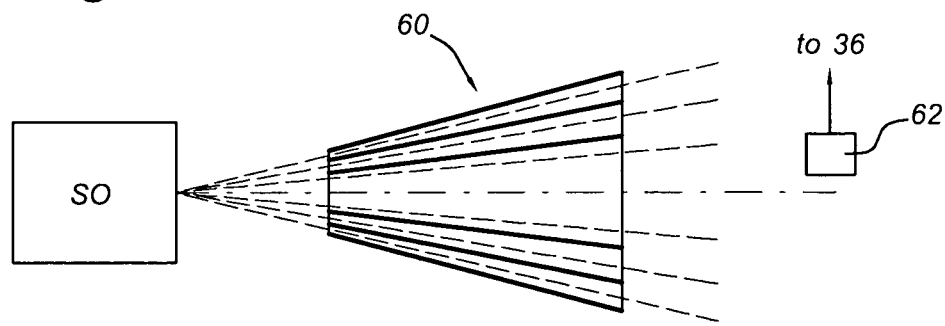
FIG. 5 depicts part of an embodiment in which the lithographic apparatus comprises a contamination barrier and a sensor downstream the contamination barrier.

According to an embodiment, a lithographic apparatus comprises a contamination barrier 60 configured to receive radiation from the radiation source SO, see FIG. 5. The lithographic apparatus further comprises a first sensor 62 configured downstream from the contamination barrier 60. The first sensor 62 may be a power sensor 62 and is positioned in the beam of radiation. The first sensor 62 measures the amount of energy per pulse or power and this value is used by the processor 36 to vary the position of the pinch in such a way that the first sensor 62 will measure a maximum energy value. By optimizing the amount of energy per pulse received by the sensor 62, the transmission value of the contamination barrier 60 is optimized.

Figure 6A:
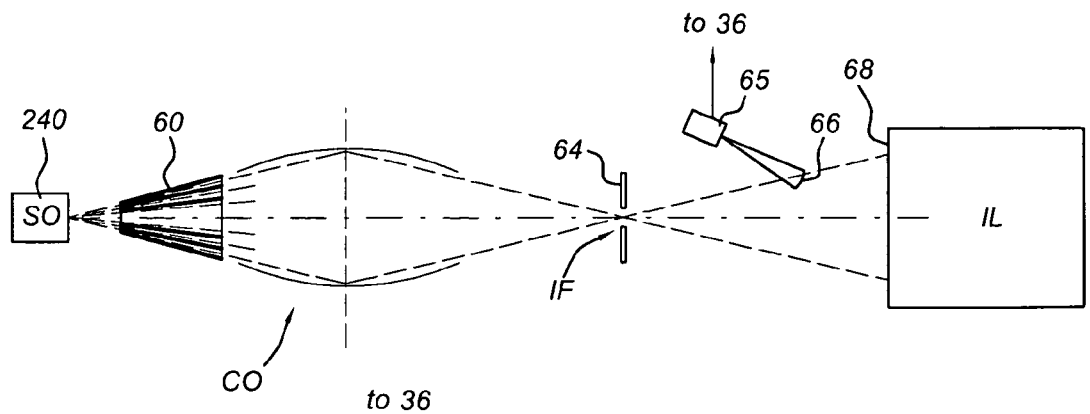
FIG. 6A depicts part of an embodiment in which the lithographic apparatus comprises a collector and a sensor configured in an intermediate focus formed by the collector.

FIG. 6A shows another embodiment wherein the lithographic apparatus comprises a collector CO configured to collect and redirect radiation coming from the radiation source SO. In this embodiment, the collector CO is configured to form an intermediate focus IF of the radiation beam, see FIG. 6A. The intermediate focus IF is positioned between the collector CO and the illuminator IL. At the IF an aperture 64 is configured which may be a diaphragm or an opening in the illuminator IL. The lithographic apparatus further comprises a sensor 65 and a mirror 66 configured near an entrance 68 of the illuminator IL. The sensor is preferably a camera 65. The mirror 66 is mounted just before the illuminator IL and makes an image of the intermediate focus image onto the camera 65. The camera 65 measures the position and shape of the intermediate focus IF. The measured position of the IF relative to the aperture 64 is used to correct the laser beam position in the radiation source SO. This measuring arrangement can also be used online. In another embodiment, just behind the aperture 64 at intermediate focus IF a power meter is configured to measure the power (i.e. amount of energy) at the intermediate focus IF.

Figure 6B:
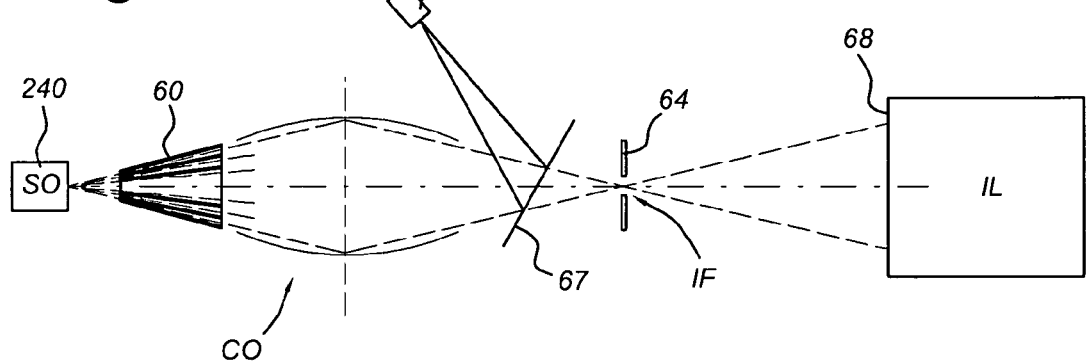
FIG. 6B depicts part of another embodiment in which the lithographic apparatus comprises a collector and a sensor configured in an intermediate focus formed by the collector.

In yet another embodiment, shown in FIG. 6B, an insertable flat mirror 67 is configured between the collector CO and the intermediate focus IF. This mirror 67, when placed in the beam, deviates the beam to a power sensor 65'. The power sensor 65' will measure the power of the beam over a predetermined time interval, or an amount of energy per pulse, and will send a signal indicative of the measured power/energy, to the processor 36. According to this embodiment, the processor 36 is configured to vary the position of the pinch in such a way that the power sensor 65' will receive the maximum amount of energy per pulse.

It is noted that instead of the intermediate focus IF being formed by the collector CO, any other optical arrangement in the projection system of the lithographic apparatus could form an intermediate focus.

Figure 7:
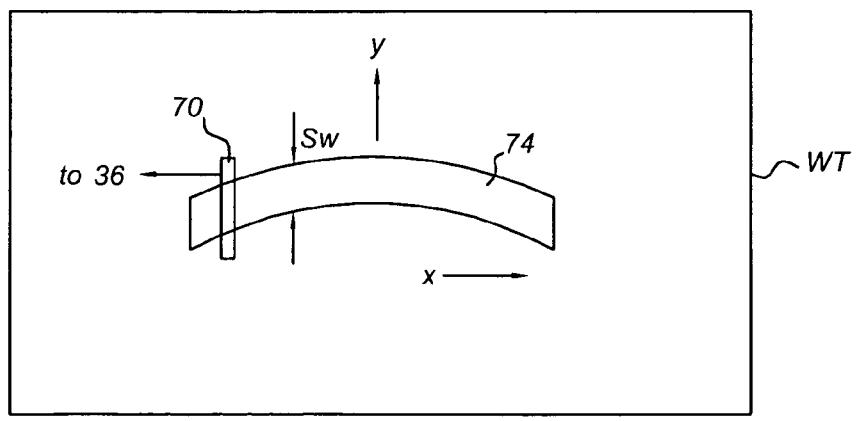
FIG. 7 depicts a top view of a substrate table of the lithographic apparatus having a sensor configured on or near the substrate table according to another embodiment.

FIG. 7 shows a schematic top view of the substrate table WT having a sensor 70 configured in or near the substrate table WT. FIG. 7 also shows an example of the radiation beam slit on the substrate table WT. The projection slit is banana shaped and has a width Sw. The sensor 70 will receive radiation when the slit passes the sensor 70. The sensor 70 is connected to processor 36 and configured to integrate the light received during the passing of the illumination slit 74 and send a measurement signal to the processor 36. As should be appreciated, the substrate table WT can be moved with respect to the illumination slit so as to measure the slit integrated uniformity of the whole slit. In this case, the slit integrated illumination for a plurality of points along the slight direction X will be measured and calculated. The total resulting curve will be processed by the processor 36 or any other computer configured for this purpose. The processor 36 will then produce a control signal for the actuator 34 so as to correct the point of radiation of the triggering device for any deviation in the slit integrated uniformity curve.

For example, a measured tilt of the slit uniformity may be input for the processor 36 so as to correct the laser position.

Figure 8:
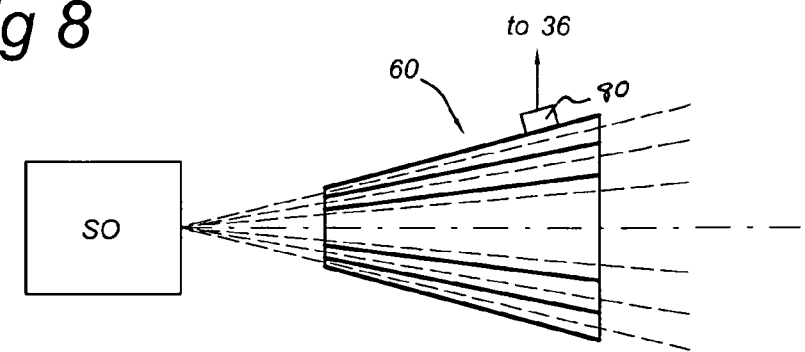
FIG. 8 depicts part of an embodiment in which the lithographic apparatus comprises a contamination barrier and a sensor configured to measure a temperature of the contamination barrier.

FIG. 8 shows yet another embodiment of the invention in which the apparatus comprises a contamination barrier 60 and a temperature sensor 80 configured to measure a temperature of the contamination barrier 60 so as to form an input signal for the triggering device described above. The temperature sensor 80 may be fixed directly to an outer shell of the contamination barrier. Other possible mounting locations on the contamination barrier 60 are on a frame of the contamination barrier 60 or on an inner cup of the contamination barrier 60. It is noted that more than one temperature sensor may be provided to measure at a plurality of points, so as to improve the accuracy of the measurements.

The processor 36 may be configured to use a mathematical model that can be used to convert a temperature of the contamination barrier 60 into a specific position of the laser beam onto the radiation source. The mathematical model may for example be designed and biased in a test phase. By exposing the contamination barrier 60 with different duty cycles at different source positions with respect to the contamination barrier 60, a model can be made which predicts the temperature of the contamination barrier 60 as a function of input power and duty cycle and source position. With one temperature sensor only the deviation of the pinch position in radial direction can be measured. If two sensors are used, one along the x-axis, one along the y-axis, a difference could be made between x and y displacement.

Figure 9:
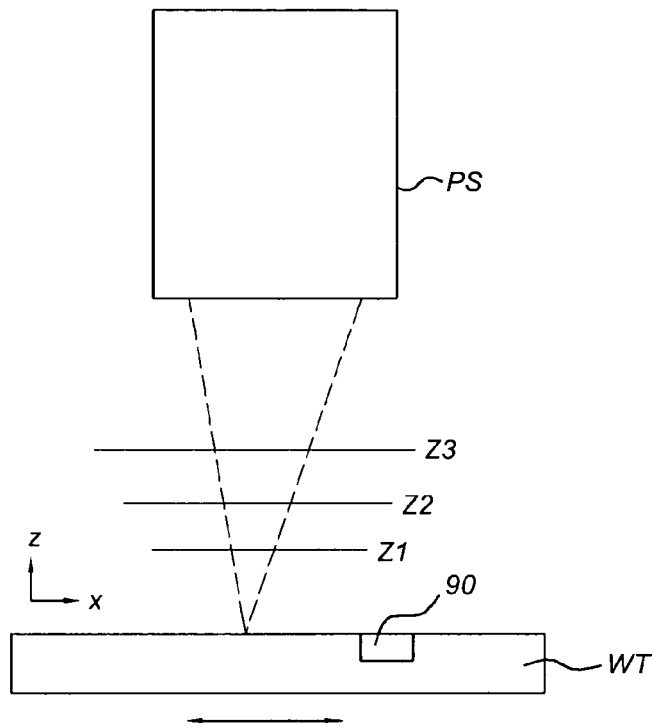
FIG. 9 depicts a substrate table with a spot sensor and a part of the projection system of a lithographic apparatus wherein three different measurement levels for measuring telecentricity are indicated.
Figure 10:
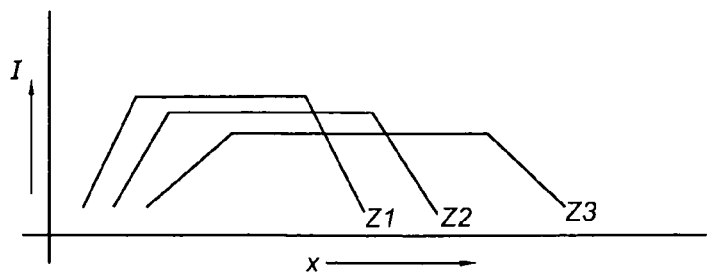
FIG. 10 depicts measurement results at the three levels indicated at FIG. 9.

FIG. 9 shows another embodiment in which a spot sensor 90, with a pinhole like an aperture, with a diameter in the order of 10-100 μm, is configured on the substrate table WT. The spot sensor 90 can be used to measure a telecentricity value at substrate level. The telecentricity can be measured in two different ways. One way is to measure the position of a square image at different z-positions at substrate level using the spot sensor 90. FIG. 10 shows an example of measurements at three different z-values, z1, z2 and z3, wherein $z1<z2<z3$. The substrate table WT is moved so that the spot sensor 90 makes a scan through the image at the three different z-heights. For example, a simple square may be used to form an image. A possible result of the intensity measured at Z1, Z2 and Z3 is shown in FIG. 10. As can be seen from FIG. 10, if the intensity profile at Z=Z3 is broader than the one at Z=Z2, which in turn is broader than the one at Z=Z1. This is a result of the specific convergence beam near the substrate table WT. Furthermore, if z increases, the centre of the intensity profile shift to the right, see FIG. 10. The shifting can be used as a measure for the telecentricity. Alternatively, markers may be used following a simular measuring method. From the displacement of the markers, a value for the telecentricity can be derived. The position of the markers will change and become less sharp, but this does not influence the result.

It should be noted that the embodiments described above may be combined and that the different sensors 62, 65, 70, 80, 90 can be connected to one or more processors configured to control the actuator of the mirror. Instead of using the mirror 32 for changing the position of the area 21, it may also be possible to use a prism, or any other suitable optical element.

Using the above described system and apparatus, it is possible to execute a method of aligning a discharge axis of a discharge radiation source with respect to optics of a lithographic apparatus. First, a discharge in a substance in a discharge space between an anode and a cathode is created to form a plasma so as to generate electromagnetic radiation. Then, the discharge is triggered by irradiating an area 21 on a surface proximate the discharge space with an energetic beam. Next, the position of the area 21 is controlled in response to a property of the radiation in the lithographic apparatus and/or the temperature of a contamination barrier 60 of the lithographic apparatus. Controlling the position of the area 21 which is irradiated, results in a better alignment of the discharge axis with the different lithographic modules, such as the contamination barrier, the illumination system, the substrate table and/or the projection system PS.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it should be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation system, comprising:
   a radiation source; and
   a triggering device configured to initiate a discharge in a discharge material in a discharge space to form a plasma so as to generate electromagnetic radiation by irradiating an area on a surface of a predetermined material different from and proximate to the discharge material in the discharge space with an energetic beam, wherein the triggering device is configured to control a position of the area in response to an input signal received from a sensor positioned downstream from the radiation source relative to a propagation direction of the electromagnetic radiation.

2. A radiation system according to claim 1, wherein the triggering device comprises:
   an energetic beam source configured to generate the energetic beam;
   a mirror configured to reflect the energetic beam to the area, and
   an actuator configured to position the mirror in response to the input signal.

3. A radiation system according to claim 2, wherein the energetic beam source is a laser.

4. A radiation system according to claim 1, wherein the input signal is indicative of a transmission of a contamination barrier.

5. A radiation system according to claim 1, wherein the input signal is indicative of a telecentricity value at substrate level in a lithographic apparatus.

6. A radiation system according to claim 1, wherein the input signal is indicative of a slit integrated uniformity level of a radiation beam in a lithographic apparatus.

7. A radiation system according to claim 1, wherein the input signal is indicative of a temperature of a contamination barrier in a lithographic apparatus.

8. A radiation system according to claim 1, wherein the input signal is indicative of a position of an intermediate focus in a lithographic apparatus relative to an aperture configured in the lithographic apparatus.

9. A lithographic apparatus, comprising:
an illumination system configured to condition a radiation beam;
a support configured to support a patterning device, the patterning device being configured to impart the radiation beam with a pattern in its cross-section to form a patterned radiation beam;
a substrate table configured to hold a substrate;
a projection system configured to project the patterned radiation beam onto a target portion of the substrate; and
a radiation system configured to provide the radiation beam, the radiation system comprising
a radiation source; and
a triggering device configured to initiate a discharge in a discharge material in a discharge space to form a plasma so as to generate electromagnetic radiation by irradiating an area on a surface of a predetermined material different from and proximate to the discharge material in the discharge space with an energetic beam, wherein the triggering device is configured to control a position of the area in response to an input signal received from a sensor positioned downstream from the radiation source relative to a propagation direction of the electromagnetic radiation.

10. A lithographic apparatus according to claim 9, further comprising:
a contamination barrier configured to receive radiation from the radiation source; and
the sensor, wherein the sensor is configured downstream from the contamination barrier and configured to measure an energy value of the radiation beam so as to form the input signal for the triggering device.

11. A lithographic apparatus according to claim 9, wherein the illumination system is configured to focus the radiation beam in an intermediate focus, the apparatus further comprising:
the sensor, wherein the sensor is configured to measure a position of the intermediate focus with respect to an aperture configured in the lithographic apparatus, so as to form the input signal for the triggering device.

12. A lithographic apparatus according to claim 9, further comprising:
the sensor, wherein the sensor is configured to measure a slit integrated uniformity at the substrate table so as to form the input signal for the triggering device.

13. A lithographic apparatus according to claim 9, further comprising:
a contamination barrier configured to receive radiation from the radiation source; and
the sensor, wherein the sensor is a temperature sensor configured to measure a temperature of a part of the contamination barrier so as to form the input signal for the triggering device.

14. A lithographic apparatus according to claim 13, further comprising:
a second temperature sensor configured to measure a second temperature of a second part of the contamination barrier so as to form the input signal for the triggering device.

15. A lithographic apparatus according to claim 9, further comprising:
the sensor, wherein the sensor is a light intensity sensor configured on or near the substrate table, the intensity sensor and the substrate table being configured to measure at a plurality of distances between the sensor and the projection system a radiation intensity level so as to form the input signal for the triggering device indicative of a telecentricity value of the projection system.

16. A method of aligning a discharge axis of a discharge radiation source with respect to optics of a radiation system, comprising:
creating a discharge in a discharge material in a discharge space to form a plasma so as to generate electromagnetic radiation;
triggering the discharge by irradiating an area on a surface of a predetermined material different from and proximate to the discharge material in the discharge space with an energetic beam; and
controlling a position of the area by controlling a position of a mirror that directs the energetic beam to the area on the surface of the predetermined material in response to at least one input signal.

17. A method according to claim 16, wherein the input signal is provided by a sensor positioned downstream from the discharge space relative to a propagation direction of the electromagnetic radiation.

18. A method according to claim 17, wherein sensor is configured to measure an energy value of the radiation beam so as to form the at least one input signal.

19. An inspection system comprising the radiation system of claim 1.

20. A metrology system comprising the radiation system of claim 1.

* * * * *